(12) United States Patent
Nascetti et al.

(10) Patent No.: US 7,339,246 B2
(45) Date of Patent: Mar. 4, 2008

(54) SENSOR ARRANGEMENT CONSISTING OF LIGHT-SENSITIVE AND/OR X-RAY SENSITIVE SENSORS

(75) Inventors: Augusto Nascetti, Aachen (DE); Michael Overdick, Langerwehe (DE)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/487,735

(22) PCT Filed: Aug. 26, 2002

(86) PCT No.: PCT/IB02/03537

§ 371 (c)(1),
(2), (4) Date: Feb. 24, 2004

(87) PCT Pub. No.: WO03/019659

PCT Pub. Date: Mar. 6, 2003

(65) Prior Publication Data

US 2004/0195640 A1  Oct. 7, 2004

(30) Foreign Application Priority Data

Aug. 30, 2001 (DE) .............................. 101 42 531

(51) Int. Cl.
H01L 27/14 (2006.01)
(52) U.S. Cl. .................... 257/428; 378/98.8
(58) Field of Classification Search .......... 257/72, 257/59, 225–234, 258, 291–293, 428; 378/187, 378/19, 98.8; 250/370.09–370.14, 208.1
See application file for complete search history.

(56) References Cited

U.S. PATENT DOCUMENTS

| | | | | |
|---|---|---|---|---|
| 5,008,541 A * | 4/1991 | Audaire et al. | .......... | 250/338.3 |
| 5,352,897 A * | 10/1994 | Horikawa et al. | ..... | 250/370.06 |
| 5,892,227 A * | 4/1999 | Schieber et al. | ....... | 250/370.12 |
| 5,998,794 A * | 12/1999 | Spivey et al. | .......... | 250/370.09 |
| 6,091,070 A * | 7/2000 | Lingren et al. | ........ | 250/370.09 |
| 6,442,238 B2 * | 8/2002 | Meulenbrugge | ........... | 378/98.8 |
| 6,483,116 B1 * | 11/2002 | Kozlowski et al. | ......... | 250/372 |
| 6,501,169 B1 * | 12/2002 | Aoki et al. | ................. | 257/700 |
| 6,510,195 B1 * | 1/2003 | Chappo et al. | ............... | 378/19 |

FOREIGN PATENT DOCUMENTS

| DE | 4002429 | 8/1991 |
|---|---|---|
| EP | 0440282 | 8/1991 |

* cited by examiner

Primary Examiner—Sara Crane

(57) ABSTRACT

The invention relates to a large-area sensor arrangement, notably a flat dynamic X-ray detector (FDXD). The light-sensitive and/or X-ray-sensitive sensors (pixels) of the sensor arrangement are arranged in a planar distribution on a substrate (1), thus forming a sensitive layer (20). On the top surface of the layer (20) there is provided a contact point (23) for each sensor, which contact point is connected to an integrated circuit (6) via one or more connection layers (30, 40). A multi-layer, very compact construction is thus obtained in which the electronic evaluation circuitry (6) is arranged in a planar fashion and parallel to the sensors (20). Preferably, a respective evaluation circuit in the circuit (6) is associated with each sensor, resulting in very short paths and also in a reduction of noise.

15 Claims, 2 Drawing Sheets

SENSOR ARRANGEMENT CONSISTING OF LIGHT-SENSITIVE AND/OR X-RAY SENSITIVE SENSORS

BACKGROUND OF THE INVENTION

The invention relates to a sensor arrangement which includes a layer of light-sensitive and/or X-ray sensitive sensors which are arranged in a distributed fashion.

Sensor arrangements provided with two-dimensional, large-area layers of light-sensitive and/or X-ray sensitive sensors are used notably for the dynamic reproduction of X-ray images in the medical field. Large-area X-ray sensors of this kind are also referred to as "flat dynamic X-ray detectors" (FDXD). FDXD-like detectors are universal detector components which can be used in a variety of application-specific X-ray apparatus. The applications include not in the least the computed tomography and nuclear medicine.

An FDXD X-ray detector is known, for example, from EP 0 440 282 B1. This known X-ray detector is based on thin-film technology in which an electrical circuit is formed by deposition of thin layers on a substrate. In conformity with EP 0 440 282 B1 there is formed a matrix arrangement which consists of photodiodes which briefly conduct an electric current, because of the absorption of photons, and thin-film transistors which enable selective coupling of the respective photodiode to read-out leads. Amorphous silicon is used as the semiconductor material. The arrangement thus obtained constitutes a large-area photosensor which can be rendered sensitive to X-rays by depositing an additional scintillator layer on the light-sensitive photodiodes. The scintillator layer then absorbs X-ray quanta and converts such quanta into light quanta which can be detected by the photodiodes.

Also known are arrangements which convert X-rays directly into electric signals. For example, DE 40 02 429 A1 describes a sensor matrix which is manufactured by means of the thin-film technology and in which storage capacitances on a thin-film plate are used instead of photodiodes and a directly converting material is used instead of the scintillator layer.

In all known FDXD-like sensors, integrated circuits such as, for example, CMOS circuits, are connected at the edge of the large-area thin-film electronics, said circuits serving for the row-wise driving of the matrix cells and for the column-wise amplification and acquisition of the signals from the matrix cells. It is a drawback that the so-called "switching noise" during the row-wise reading out of the matrix and the long connection leads between the individual sensors and the circuits give rise to a comparatively high noise level.

OBJECTS AND SUMMARY OF THE INVENTION

Considering the foregoing it is an object of the present invention to provide an improved sensor arrangement which comprises a large-area array of light-sensitive and/or X-ray sensitive sensors and involves less signal noise.

This object is achieved by means of a sensor arrangement as disclosed in claim 1. Advantageous embodiments are disclosed in the dependent claims.

The proposed sensor arrangement includes a layer of two-dimensionally distributed light-sensitive and/or X-ray sensitive sensors, each of which comprises at least one contact point. On this layer of sensors, and parallel thereto, there is arranged at least one component with an integrated circuit which is preferably formed by means of the semiconductor technique, which component is connected to said contact points and is arranged to read out the sensor signals. The sensor arrangement is preferably a large-area arrangement, meaning that it typically comprises several thousands of individual sensors and occupies a surface area of the order of magnitude of from some square centimeters to several hundreds of square centimeters. The contact points formed on the sensors are preferably all situated on one side of the two-dimensional sensor arrangement, even though this is not absolutely necessary. Furthermore, between the sensor layer and the integrated circuits there is provided at least one connection layer which contains electrical leads connecting the integrated circuits to the contact points of the sensors and/or to external terminals. The external terminals may notably be voltage supply terminals.

The proposed sensor arrangement has an essentially two-level structure, the first level containing the layer of light-sensitive and/or X-ray sensitive sensors whereas the second level, extending parallel to the first level, contains the components with the integrated circuits. For the sake of brevity the components with the integrated circuits will also be referred to as "integrated circuits" hereinafter. Because of the described two-level construction, the connections from the individual sensor elements to the read-out electronic circuitry need not be routed across the entire surface as far as the edge, but may extend perpendicularly to the layer of sensor elements, that is, along the shortest path to the integrated circuits which neighbor the sensors and extend parallel thereto. An arrangement of this kind offers the advantage of short connection paths, resulting in a reduction of noise in the signals. Furthermore, it is also possible to provide each sensor with its own "pixel electronic circuitry".

From a geometrical point of view the circuit arrangement also has the advantage that it enables a very compact construction of the large-area sensor, including the integrated circuits. More integrated circuits than allowed by the present state of the art can now be used, because the entire surface area is now available and not only the edge of the sensors, be it that on the other hand it is not necessary either to fill the entire surface with integrated circuits.

Because of the one or more connection layers, the sensors can be connected to the integrated circuits with adapted connection distances. Consequently, the terminals of the integrated circuit need not be situated geometrically exactly over the sensors while the advantage of short lead paths is preserved nevertheless. Furthermore, using the connection layers, the requirements imposed as regards the precision of alignment during mounting can be kept within moderate limits for the connection technique used, for example, the bump bond technology.

The integrated circuits of the sensor arrangement are preferably formed by means of the CMOS technology. This is an established and time-tested semiconductor technique which enables operation with small supply voltages.

The connection layer may include at least one electrically insulating layer wherethrough vias of an electrically conductive material extend. The insulating layer provides electrical separation of the electric leads from the surface of the sensor layer, thus offering more freedom in respect of the routing of such leads.

Preferably, the connection layer is permanently connected to the sensor layer. This can be realized notably by direct deposition of the connection layer on the sensors and their contact points, so that the connection layer and the sensor layer contact one another over a large area and are connected to one another by material retention.

The distance between the contact points of neighboring sensors in the proposed sensor arrangement may differ from the distance between the terminals of the integrated circuit which are associated with the contact points. The contact points may notably be situated at a distance which is larger than that between the associated terminals of the integrated circuit. The adaptation of the various distances, which may also be referred to as "fan-in" or "fan-out", is in this case provided by the connection layer. The possibility of such adaptation enables an optimum choice of the distances between the contact points on the one side and the distances between the terminals on the other side, that is, in respect of the sensors or the integrated circuits. Notably the integrated circuits formed, for example, by means of the CMOS technology, may be reduced to minimum dimensions.

The light-sensitive and possibly also the X-ray sensitive sensors are formed on a substrate preferably by means of the thin-film technique. The connection layer can also be advantageously formed by means of the thin-film technique. According to the thin-film technique which is known from the state of the art, materials for forming resistors, capacitors, conductor tracks and the like are deposited by vapor deposition or dusting while utilizing masks. Moreover, additional process steps such as etching may be carried out. As a result of the formation of the sensor pixel matrix in such a large-area process, the contact points have a suitable mechanical precision. Consequently, the position of the pixels is determined exactly; this is important for correct imaging.

The formation of the sensor arrangement in accordance with the invention enables a high yield to be obtained for the complete arrangement, because on the one hand the large-area sensor layers are structured very simply and coarsely and on the other hand the integrated circuits have conventional dimensions and can be tested in advance. If desired, such integrated circuits may also be individually replaced should they exhibit a defect. The mounting of the integrated circuit on the connection layer can be carried out by means of standard methods (for example, bump bonding) so that it is also comparatively uncritical.

The sensors may notably be sensitive to X-rays and hence consist of a material which converts X-rays directly into electric signals. This material may be, for example, germanium (Ge), amorphous selenium (Se), gallium arsenide (GaAs), cadmium telluride (CdTe), cadmium zinc telluride (CdZnTe), lead oxide (PbO), lead iodide ($PbI_2$) and/or mercury iodide ($HgI_2$). Directly converting sensors offer the advantage that signal errors and noise as induced by additional converting steps are avoided.

Alternatively, the sensors may also be sensitive to X-rays and have a two-level structure of an X-ray sensitive scintillation layer and a light-sensitive photolayer. In sensors of this kind X-ray quanta are converted in the scintillation layer so as to form light quanta which can subsequently be detected in the light-sensitive photolayer.

The sensors in the latter structure may notably include photodiodes in the light-sensitive photolayer, which diodes are advantageously photodiodes of amorphous silicon (Si).

The distribution of the sensors throughout the layer thus formed in the sensor arrangement is preferably shaped as a grid, that is, in conformity with a regular, periodic pattern. The arrangement may notably be a hexagonal grid and/or a matrix, that is, a rectangular grid with rows and columns. The grid is subdivided into cells, exactly one integrated circuit being associated with each of said cells. The large number of typically several thousands of individual sensors is thus subdivided into smaller groups of sensors which are situated in a respective common cell, all sensors of such a cell then being connected to the same integrated circuit. Such a modular decomposition of the entire sensor layer offers the advantage that the surface area of the integrated circuits may be smaller than the surface area occupied by the associated sensors while at the same time short connection paths are still maintained, because the excess surface area of the sensors thus arising is uniformly distributed (in the form of a grid) across the entire sensor arrangement. Furthermore, a sensor arrangement of this kind is better protected against failures, because the failure of an integrated circuit can concern no more than one cell of the grid arrangement and not the entire grid. If necessary, an individual integrated circuit may also be replaced for repair.

In the latter grid-like arrangement of the sensors, preferably between approximately 1000 (one thousand) and approximately 100,000 (one hundred thousand), but notably preferably between 10,000 (ten thousand) and 100,000 (one hundred thousand) individual sensors are arranged in a cell, all of said sensors being associated with a single integrated circuit. For such numbers an optimum compromise is achieved between the distribution of the read-out electronic circuitry among as few as possible integrated circuits and the need for as short as possible connection paths.

In conformity with a preferred embodiment of the sensor arrangement, a respective read-out electronic circuit is associated with each sensor. Said read-out electronic circuit may form part of an integrated circuit which comprises a plurality of such read-out electronic circuits for several sensors. Because of the direct connection of each sensor to the associated integrated read-out electronic circuit, the sensors need no longer be addressed by way of row and column addresses. The switching noise induced by such addressing operations is thus eliminated. A further advantage of the direct and permanent connection of each sensor to an associated read-out electronic circuit consists in that the read-out speed is higher than that achieved by addressed reading out. Furthermore, with each sensor (pixel) there may be associated a respective read-out circuit with for each sensor a respective preamplifier, enabling complex signal processing such as, for example, energy detection, counting, event-controlled reading out, dose detection, frame transfer and the like.

The invention also relates to an imaging device which is characterized in that it includes a sensor arrangement of the kind set forth. This device may notably be an X-ray examination apparatus, a computed tomography apparatus and/or a nuclear medical examination apparatus.

BRIEF DESCRIPTION OF THE DRAWING OBJECTS

The invention will be described in detail hereinafter, by way of example, with reference to the FIGS. Therein:

DETAILED DESCRIPTION OF THE INVENTION

Figure 1:
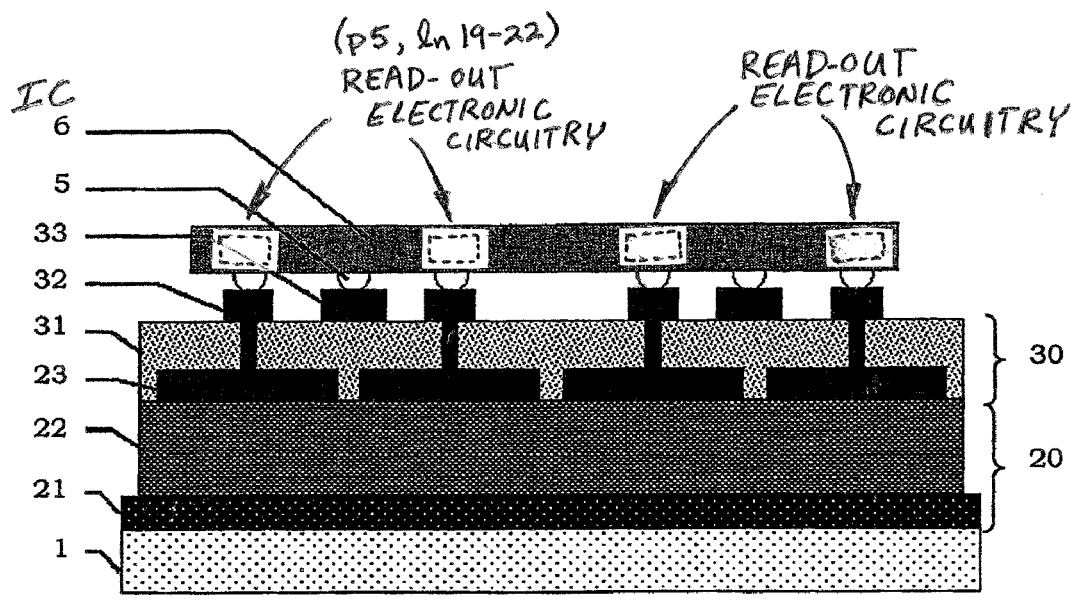
FIG. 1 is a diagrammatic representation of the layer-like structure of a sensor arrangement in accordance with the invention which includes a connection layer.

FIG. 1 is a diagrammatic side elevation of a part of a first sensor arrangement in accordance with the invention. The present example concerns a large-area X-ray detector which can be used notably for medical applications.

The entire sensor arrangement is built up on a substrate 1 of, for example, glass. The structure of this sensor arrangement is in principle a three-layer structure with three different layers which are arranged on one another and extend parallel to the substrate 1. The first layer 20 is the signal generating layer which absorbs incident photons (incident from below in FIG. 1) which are converted into electric signals such as, for example, charge signals. The connection layer 30 which is arranged over the signal generating layer 20 establishes electrical connections between individual sensors (pixels) in the layer 20 and an electronic evaluation circuit. The evaluation circuit forms the third layer and consists of "two-dimensional" CMOS components 6 of integrated circuits which are arranged on and in contact with the connection layer 30.

The signal generating layer 20 itself has a three-layer structure; at the bottom and in contact with the substrate 1 there is formed a flat rear contact 21 which serves notably as an electrode which receives a given, externally applied potential. The light-sensitive and/or X-ray sensitive structure 22 is arranged over and in contact with the rear contact layer 21. The construction of layers of this kind is known in principle and is described, for example, in DE 40 02 429 A1 or in DE 42 27 096 A1. The layer 22 may notably consist of a directly converting material such as a-Se, PbO, $PbI_2$ or the like. Alternatively, the sensor layer 22 may consist of a photodiode, for example, a PIN photodiode made of amorphous silicon. In that case the entire structure (with the exception of the integrated circuits 6) can be manufactured by means of a conventional a-Si thin-film process.

The pixel contacts 23 are provided in the form of a matrix-like grid on the light-sensitive and/or X-ray sensitive layer 22. These contacts are planar elements of an electrically conductive material, notably metal. The signal of a single light-sensitive and/or X-ray sensitive sensor (pixel) can be derived from the respective pixel contacts 23.

The connection layer 30 is provided directly on the light-sensitive and/or X-ray sensitive layer 22 and encapsulates the pixel contacts 23 by means of a passivation layer 31. Pixel connections 32 which contact a respective pixel contact 23 and form a contact point on the surface of the passivation layer 31 extend through the passivation layer 31. On the surface of the passivation layer 31 there are provided additional connection leads 33 which extend, for example, from the integrated circuits to the edge of the sensor arrangements where they may be connected to the supply voltage.

Finally, over the connection layer 30 there is provided the layer with the integrated circuits (ICs) 6. The individual integrated circuits 6 are electrically connected to the pixel connections 32 or the other connection leads 33 via a contact material 5 which may be indium bump bonds.

The arrangement of the large-area signal generating layer 20, the connection layer 30 and the integrated circuits 6 provided thereon results in a very compact construction of the large-area sensor. Overall a larger number of circuits can be accommodated because, as opposed to the present state of the art, not only the edge around the sensors is available for this purpose. The individual pixels which are present underneath the pixel contacts 23 are preferably connected directly and permanently to a respective associated circuit, notably an associated preamplifier, in the integrated circuit 6. The noise of the pixel electronic circuitry is thus drastically reduced (switching noise and long connections are eliminated). Furthermore, intelligent pixel electronic circuitry can be implemented, comprising signal processing with energy detection, counting, event-controlled reading out, dose detection, frame transfer and the like.

Figure 2:
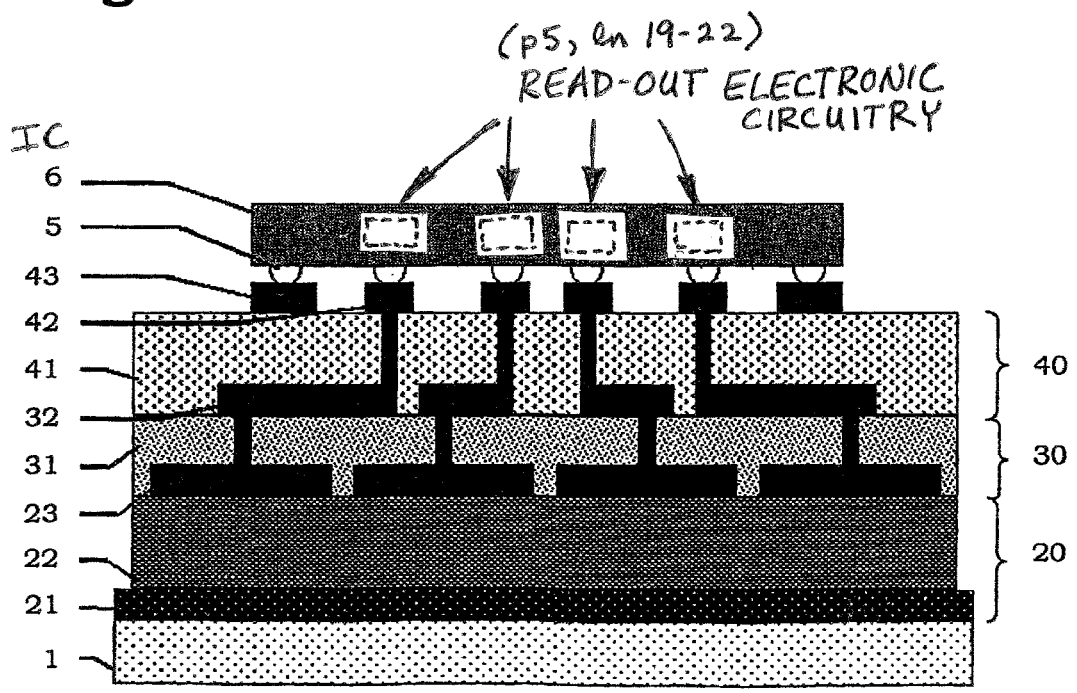
FIG. 2 shows diagrammatically the layer-like construction of a sensor arrangement in accordance with the invention which includes two connection layers.

FIG. 2 shows an alternative structure of a sensor arrangement. This structure deviates from that of FIG. 1 in that a further connection layer 40 is arranged over the first connection layer 30. The integrated circuits 6 are provided on said second connection layer 40. The reference numerals and the elements characterized thereby correspond to those of FIG. 1, and the second connection layer 40 comprises, analogous to the first connection layer 30, a passivation layer 41, pixel connections 42 and additional connection leads 43 on its surface. One of the connection layers may accommodate the supply voltage leads and further leads to and from the integrated circuits and be connected, for example, to bond pads at the edge of the sensor arrangement. As is shown in the FIG., the second connection layer 40 may be used, in addition to the first connection layer 30, to transform the matrix-like distribution of pixel contacts 23 into a different, preferably spatially denser distribution of pixel connections 42 (fan-in). Such a denser pattern of pixel connections 42 is then suitable for the contacting by the integrated circuits 6. Furthermore, in the second connection layer 40 there may be provided further electrical connections so that more freedom exists as regards the routing of connections.

The sensor arrangements shown in the FIGS. 1 and 2 can be realized by means of known technologies, that is, on the one hand by the large-area production of layers 20 and connection layers 30 and 40, for example, as known from the thin-film technology, and on the other hand by means of known connection techniques customarily used for integrated circuits, notably the so-called bump bonding.

Figure 3:
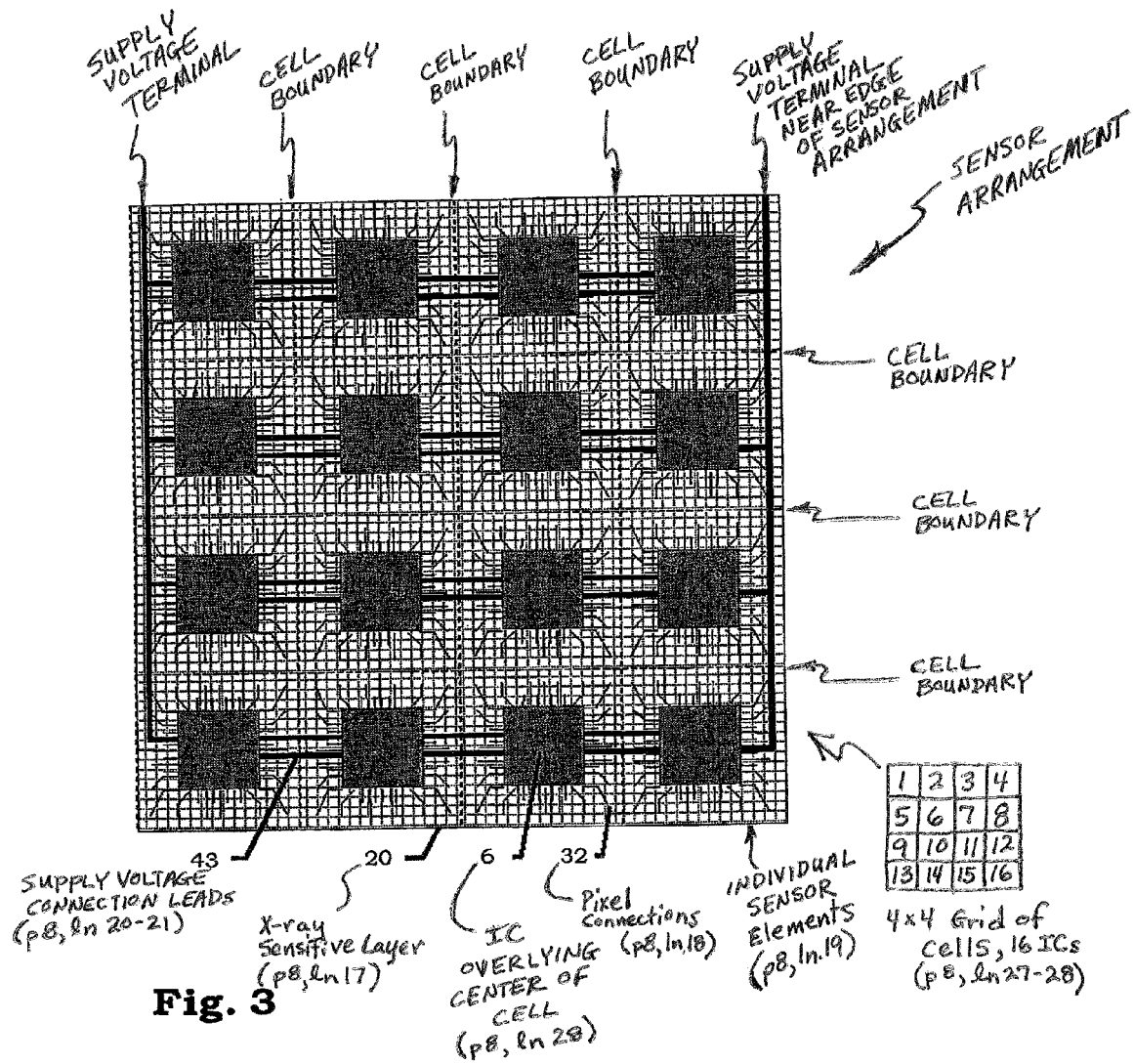
FIG. 3 is a plan view of a sensor arrangement in accordance with the invention which includes 16 integrated circuits which are matrix-like distributed in cells.

FIG. 3 is a plan view of a complete sensor arrangement, that is a view taken while looking at the integrated circuits 6. The FIG. shows the light-sensitive and/or X-ray sensitive layer 20 which consists of individual sensors and on which the connection layer with the pixel connections 32 is provided. The pixel connections 32 again lead to the integrated circuits (ICs) 6 and couple these circuits to the individual sensor elements. Furthermore, on the surface of the connection layer there are provided connection leads 43 which lead from the ICs 6 to external terminals for a supply voltage.

As can also be seen in FIG. 3, the entire sensitive surface 20 is occupied by sensors or pixels in a matrix-like arrangement, the number of sensor pixels on the entire surface amounting to 512×512 in the example shown. The pixel pitch amounts to 200 µm (the term pitch is to be understood as the distance of recurrence of similar structures) and the dimensions of the active surface are approximately 10×10 $cm^2$. The matrix of 512×512 sensor pixels is (logically) subdivided into 16 sub-matrices or cells, with each cell there being associated exactly one integrated circuit 6 which is arranged centrally on the cell. The number of pixel channels per integrated circuit 6 thus amounts to 128×128 and the bond pitch amounts to, for example, 80 µm (=pixel pitch in the IC).

The surface area of the integrated circuits 6, preferably formed by means of the CMOS technology, is smaller than the active surface area of the sensors. In the present embodiment the ratio of the surface area of the ICs 6 to the active surface area of the sensors amounts to $80^2/200^2=0.16$ (to approximately 20% with additional connections etc.). For a given cell geometry, this factor also remains constant for larger sensor surface area with, for example, 2048×2048 pixels.

The invention claimed is:

1. A sensor arrangement comprising:
a layer of sensors arranged in a distributed fashion, said layer of sensors being sensitive to X-rays, each sensor including a pixel contact;
an integrated circuit containing read-out electronic circuits and being disposed parallel to said layer of sensors, each read-out electronic circuit being configured to read out a signal from a sensor of said layer of sensors, wherein individual sensors of said layer of sensors are associated with corresponding read-out electronic circuits of said integrated circuit; and
a connection layer provided in between said layer of sensors and said integrated circuit, said connection layer (i) being disposed directly on said layer of sensors to define a surface, (ii) contains, for each sensor of said layer of sensors, at least one pixel connection disposed at said surface, wherein the at least one pixel connection is electrically coupled through the connection layer to the pixel contact of a corresponding sensor of said layer of sensors, (iii) contains electrical leads arranged between said layer of sensors and said integrated circuit configured to couple supply voltage connections of said integrated circuit to external terminals proximate an edge of the sensor arrangement, and (iv) electrically connects a read-out electronic circuit of the integrated circuit to a pixel connection from among said at least one pixel connection.

2. A sensor arrangement as claimed in claim 1, wherein the connection layer includes at least one electrically insulating layer and wherein the at least one pixel connection electrically couples through the connection layer to the pixel contact of a corresponding sensor of said layer of sensors using vias comprising an electrically conductive material.

3. A sensor arrangement as claimed in claim 1, wherein the connection layer is permanently connected to said layer of sensors.

4. A sensor arrangement as claimed in claim 1, wherein the integrated circuit includes terminals associated with pixel contacts of the sensors of said layer of sensors by way of said pixel connections, a distance between said pixel contacts exceeding a distance between the associated terminals.

5. A sensor arrangement as claimed in claim 1, wherein said layer of sensors and the connection layer are constructed using thin-film technology.

6. A sensor arrangement comprising:
a layer of sensors arranged in a distributed fashion, said layer of sensors being sensitive to X-rays, each sensor including a pixel contact;
an integrated circuit containing read-out electronic circuits and being disposed parallel to said layer of sensors, each read-out electronic circuit being configured to read out a signal from a sensor of said layer of sensors, wherein individual sensors of said layer of sensors are associated with corresponding read-out electronic circuits of said integrated circuit; and
a connection layer provided in between said layer of sensors and said integrated circuit, said connection layer (i) being disposed directly on said layer of sensors to define a surface, (ii) contains, for each sensor of said layer of sensors, at least one pixel connection disposed at said surface, wherein the at least one pixel connection is electrically coupled through the connection layer to the pixel contact of a corresponding sensor of said layer of sensors, (iii) contains electrical leads arranged between said layer of sensors and said integrated circuit configured to couple supply voltage connections of said integrated circuit to external terminals proximate an edge of the sensor arrangement, and (iv) electrically connects a read-out electronic circuit of the integrated circuit to a pixel connection from among said at least one pixel connection, wherein the sensors comprise a material which converts X-rays directly into electrical signals.

7. A sensor arrangement as claimed in claim 1, wherein the sensors have a two-layer structure comprising an x-ray sensitive scintillation layer, and a light-sensitive photolayer.

8. A sensor arrangement as claimed in claim 7, wherein said light-sensitive photolayer comprises a photodiode.

9. A sensor arrangement as claimed in claim 1, wherein the sensors are arranged in a grid, wherein the grid is subdivided into cells, wherein said sensor arrangement further comprises a number of integrated circuits, each integrated circuit having read-out electronic circuits, and wherein exactly one integrated circuit is associated with each cell.

10. A sensor arrangement as claimed in claim 1, wherein the read-out electronic circuit of the integrated circuit associated with each of said sensors comprises a respective read-out electronic circuit that includes a preamplifier for each respective sensor.

11. An imaging device for performing medical investigations and/or examinations, which includes a sensor arrangement as claimed in claim 1.

12. The sensor arrangement of claim 1, wherein said integrated circuit further comprises a number of integrated circuits, each integrated circuit containing a respective read-out electronic circuit configured to read a signal from a sensor of said layer of sensors.

13. The sensor arrangement of claim 1, wherein the connection layer encapsulates the pixel contacts.

14. A sensor arrangement comprising:
a layer of sensors arranged in a distributed fashion, said layer of sensors being sensitive to X-rays, each sensor including a pixel contact;
an integrated circuit containing read-out electronic circuits and being disposed parallel to said layer of sensors, each read-out electronic circuit being configured to read out a signal from a sensor of said layer of sensors, wherein individual sensors of said layer of sensors are associated with corresponding read-out electronic circuits of said integrated circuit;
a first connection layer provided in between said layer of sensors and said integrated circuit, said first connection layer (i) being disposed directly on said layer of sensors to define a surface, (ii) contains, for each of sensor of said layer of sensors, at least one first pixel connection disposed at said surface, wherein the at least one first pixel connection is electrically coupled through the first connection layer from a pixel contact of a corresponding sensor of said layer of sensors, and (iii) electrically connects a read-out electronic circuit of the integrated circuit to a first pixel connection from among said at least one first pixel connection; and
a second connection layer provided in between said layer of sensors and said integrated circuit, said second connection layer (i) being disposed directly on said first connection layer to define a second surface and (ii) containing, for each of said sensors, at least one second pixel connection disposed at said second surface, wherein the at least one second pixel connection is electrically coupled through the second connection layer to a corresponding pixel connection of the at least one first contact structure, (iii) contains electrical leads arranged between said layer of sensors and said integrated circuit configured to couple supply voltage connections of said integrated circuit to external terminals proximate an edge of the sensor arrangement, and (iv) electrically connects a read-out electronic circuit of the integrated circuit to a second pixel connection from among said at least one second pixel connection.

15. A sensor arrangement as claimed in claim 6, wherein the material is constructed from at least one of the following: Ge, amorphous Se, GaAs, CdTe, CdZnTe, PbO, $PbI_2$ and $HgI_2$.

* * * * *